United States Patent
Spotti

(10) Patent No.: US 10,290,764 B2
(45) Date of Patent: May 14, 2019

(54) PROCESS FOR AUTOMATIC ASSEMBLY OF PHOTOVOLTAIC PANELS

(71) Applicant: VISMUNDA SRL, Padua (PD) (IT)

(72) Inventor: Davide Spotti, Trieste (IT)

(73) Assignee: VISMUNDA SRL, Padua (IT)

(*) Notice: Subject to any disclaimer, the term of this patent is extended or adjusted under 35 U.S.C. 154(b) by 0 days.

(21) Appl. No.: 15/862,226

(22) Filed: Jan. 4, 2018

(65) Prior Publication Data

US 2018/0130923 A1  May 10, 2018

Related U.S. Application Data

(62) Division of application No. 14/744,656, filed on Jun. 19, 2015.

(30) Foreign Application Priority Data

Jun. 20, 2014  (IT) .............................. TV2014A0087

(51) Int. Cl.
*H01L 31/18* (2006.01)
*H01L 31/05* (2014.01)
*H01L 21/677* (2006.01)

(52) U.S. Cl.
CPC ........ *H01L 31/188* (2013.01); *H01L 31/0504* (2013.01); *H01L 21/677* (2013.01); *H01L 31/18* (2013.01); *H01L 31/1876* (2013.01); *Y02E 10/50* (2013.01)

(58) Field of Classification Search
CPC ... H01L 21/677; H01L 31/0504; H01L 31/18; H01L 31/1876; H01L 31/188; Y02E 10/50
See application file for complete search history.

(56) References Cited

U.S. PATENT DOCUMENTS

| 4,233,085 | A | * | 11/1980 | Roderick | ................ | H02S 30/10 |
| | | | | | | 136/244 |
| 4,260,429 | A | * | 4/1981 | Moyer | .............. | H01L 31/02167 |
| | | | | | | 136/256 |
| 4,321,418 | A | * | 3/1982 | Dran | ................. | B32B 17/10036 |
| | | | | | | 136/251 |
| 4,400,577 | A | * | 8/1983 | Spear | ................ | B32B 17/10009 |
| | | | | | | 136/244 |
| 4,443,652 | A | * | 4/1984 | Izu | ........................ | H01L 31/076 |
| | | | | | | 136/244 |

(Continued)

*Primary Examiner* — Carl J Arbes
(74) *Attorney, Agent, or Firm* — Egbert Law Offices, PLLC

(57) ABSTRACT

A plant and system for the automatic horizontal assembly of photovoltaic panels with front-back-contact solar cells of crystalline silicon, of the type called H-type, the contacting being carried out at a temperature lower than 150° C. also with the pre-fixing of conductive elements onto the encapsulating layer. The plant and system solve the main problems of the conventional stringing systems and provides high production capacity with a precise positioning of the components. The plant is made up of single workstations of the modular type which are arranged sequentially in a linear series, individually equipped according to the specific working process, being adjacent and laterally open to be crossed by the conveying line of the trays containing the panels being worked. After the automatic assembly in the plant, the panels are ready to be rolled in conventional furnaces.

11 Claims, 10 Drawing Sheets

(56) References Cited

U.S. PATENT DOCUMENTS 4,604,494 A * 8/1986 Shepard, Jr. .......... H01L 31/052
 136/244
4,707,561 A * 11/1987 Hewig ............ H01L 31/022425
 136/256

* cited by examiner

| F5: LAYING OF CELLS AND INTERCONNECTING RIBBONS FROM THE HEAD  (station 100E complementary of 100D) | F5.0 TRANSFER AND LOCKING OF TRAY (FROM 100D)<br>F5.1 MEASURED DISPENSING OF ECA ON INTERCONNECTING RIBBONS STARTING FROM THE HEAD IN AN ALTERNATED SERIES<br>F5.2 LAYING OF CELLS ON FIRST HEAD ROW IN AN ALTERNATED SERIES<br>F5.3 PRE-FIXING OF CELLS<br>F5.4 MEASURED DISPENSING OF ECA ON ROW OF CELLS<br>F5.5 LAYING OF INTERCONNECTING RIBBONS ON ROW OF CELLS<br>F5.6 PRE-FIXING OF ROW OF CELLS AND INTERCONNECTING RIBBONS<br>F5.7 REPETITION FROM F5.1 FOR EACH FOLLOWING ROW TO COMPLETE THE LAST ROW WITH FINAL RIBBONS<br>FV5 CHECK |
|---|---|
| F6: LAYING OF FRONT EVA LAYER  (station 100F) | F6.0 TRANSFER AND LOCKING OF TRAY (FROM 100E)<br>F6.1 UNWINDING OF SHEET OF EVA THERMOPLASTIC MATERIAL<br>F6.2 CUTTING<br>F6.3 PICKING AND LAYING<br>FV6 CHECK |
| F7: LAYING OF FRONT GLASS  (station 100G) | F7.0 TRANSFER AND LOCKING OF TRAY (FROM 100F)<br>F7.1 PICKING AND LAYING OF GLASS<br>FV7 CHECK |
| F8: OVERTURN AND UNLOADING OF COMPLIANT PANEL  (station 100H) | F8.0 TRANSFER AND LOCKING OF TRAY (FROM 100G)<br>F8.1 OVERTURN WITH COUNTER-OVERTURN OF TRAY<br>F8.2 OUTCOMING OF PANEL ON BELT WITH GLASS FACING DOWNWARDS |
| F9A: RECIRCULATION OF COMPLIANT PANEL  (station 100I) | F9A.0 TRANSFER AND LOCKING OF EMPTY TRAY (FROM 100H)<br>F9A.1 DESCENT OF TRAY TO LOWER LEVEL FOR RECIRCULATION |
| F9B: UNLOADING OF NON-COMPLIANT PANEL FOR REPROCESSING  (station 100J) | F9B.0 TRANSFER OF TRAY WITH PANEL (FROM 100H)<br>F9B.1 OUTCOMING OF TRAY WITH PANEL FOR ANALYSIS OR REPROCESSING<br>F9B.2 INCOMING OF TRAY WITH PANEL |

Fig. 8b

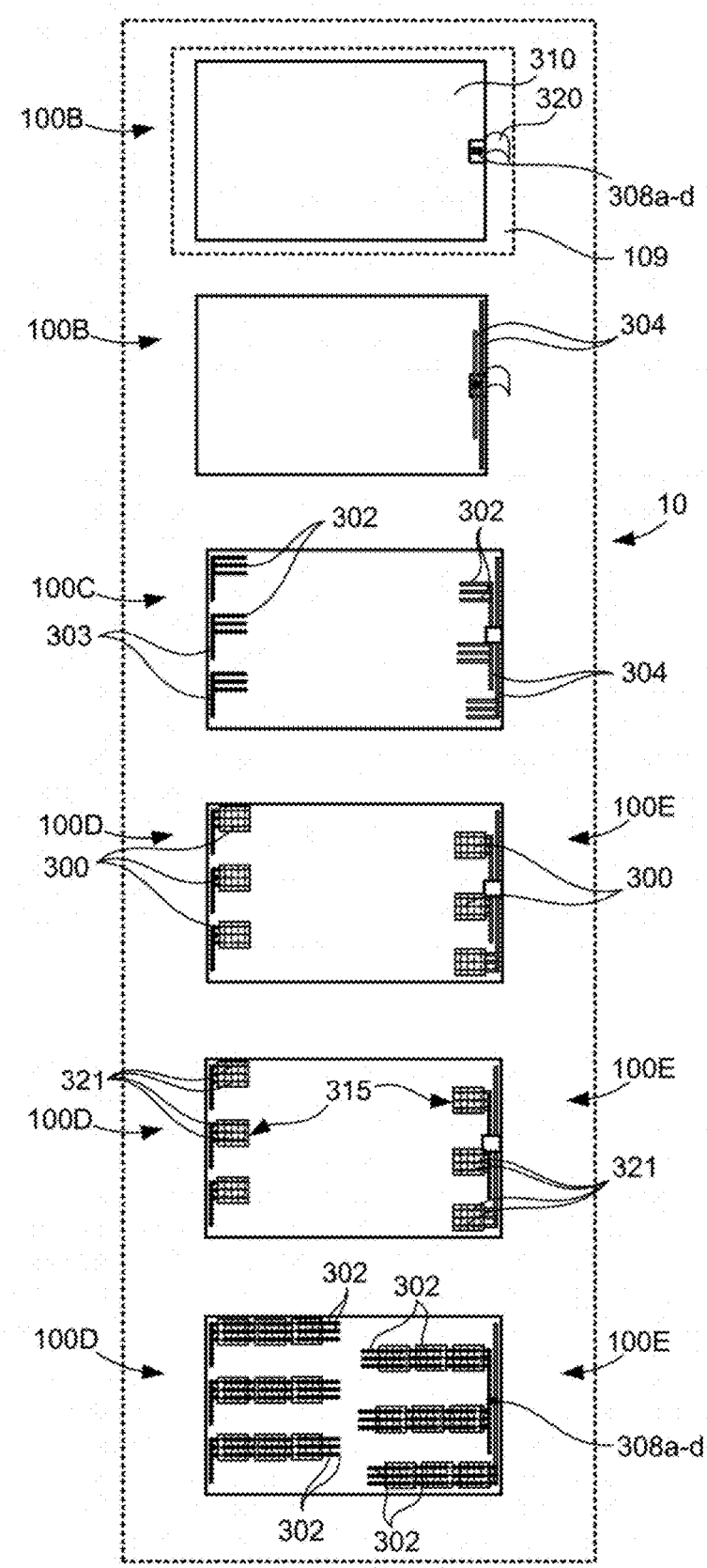

PROCESS FOR AUTOMATIC ASSEMBLY OF PHOTOVOLTAIC PANELS

CROSS-REFERENCE TO RELATED U.S. APPLICATIONS

The present application claims divisional priority to U.S. application Ser. No. 14/744,656, filed on Jun. 19, 2015, presently pending.

STATEMENT REGARDING FEDERALLY SPONSORED RESEARCH OR DEVELOPMENT

Not applicable.

NAMES OF PARTIES TO A JOINT RESEARCH AGREEMENT

Not applicable.

REFERENCE TO AN APPENDIX SUBMITTED ON COMPACT DISC

Not applicable.

BACKGROUND OF THE INVENTION

1. Field of the Invention

The present invention relates to a plant and system for the automatic horizontal assembly of photovoltaic panels having solar cells of crystalline silicon of the H-type, with the front-back connection of the cells carried out at low temperature and with pre-fixing; said plant and said system, being particularly of the automatic type with high production capacity and great precision and accuracy in the positioning of the components.

2. Description of Related Art Including Information Disclosed Under 37 CFR 1.97 and 37 CFR 1.98

The invention finds particular application in the industrial sector of production of photovoltaic panels, with specific reference to the panels of first generation with cells of monocrystalline or polycrystalline silicon having the electrical contacts of opposite polarity placed respectively on the front and on the back of the cell, also called H-type, also with the modern evolutions of such cells, such as the cells of the hetero junction type also known by the acronym HIT™ or HJT.

The basic components of a panel having an H-type architecture starting from the back side not exposed to the sun substantially are: a back layer of support and protection from the weather, also called backsheet; said photovoltaic cells of monocrystalline or polycrystalline silicon; the longitudinal interconnection ribbons intended to weld in series two by two the front and the back of adjacent cells; the conductive cross ribbons at the head and at the bottom of the panel, for the general connection in series of said longitudinal ribbons with interposed diodes in the junction box; two layers of encapsulating material, generally ethylene vinyl acetate or EVA, intended to enclose at the front and at the back said cells with said interconnecting ribbons and cross ribbons; a flat glass which encloses and protects the front side of the panel, exposed to the sun; a frame which encloses the perimeter of the panel; said junction box being placed on the back side of said backsheet, for the purpose of collecting the contacts from the back connecting to said cross ribbons. For example, see the tables of the known prior art (FIGS. 1, 2).

This configuration of a photovoltaic panel today is the best known and most widespread on the market; however, it has been observed that the process of assembly of such a panel solution is slow and imprecise as it is carried out mostly manually, except for the welding of said interconnecting ribbons to the cells. The process generally provides to start the assembly of the components from the front glass placed on a horizontal plane, on which an encapsulating layer of EVA is superimposed, then the stringing on the front and on the back of the single cells by welding, then the positioning of all the conductive elements with the following welding between interconnecting ribbons and cross ribbons, the visual inspection, the positioning of the back encapsulating layer and of the supporting backsheet, the rolling in the furnace for fixing and encapsulating the components and, then, the final assembly of the junction box and frame.

Furthermore, it has been observed that the conventional technologies of electrical interconnection of the cells on the front and on the back, although made by automated welding procedures, can be widely improved due to the known problems of discontinuity in the adhesion and therefore in the resistance of contact, of deformation, of differentiated thermal expansion with consequent residual stresses and due to some production and quality problems, described in the following.

In more detail as to the architecture of said cells of the H-type, it has been observed that some improvements have been recently introduced, which are intended to facilitate said welding phase and also to improve the collection efficiency of the photovoltaic currents by means of innovative solutions of surface metallization to form the electrodes. Traditionally, the main conductive elements present on the front side of the cell, called busbars, are generally placed in a parallel way and spaced from each other to collect the currents of electrons picked up superficially by the thin conductive elements arranged orthogonally, called fingers, for the purpose of conveying them by means of said interconnecting ribbons to said cross ribbons at the head and bottom of the panel; the conduction of said currents from said front busbars of each cell to the busbars of opposite sign placed on the back of the adjacent cell is obtained by means of interconnecting ribbons welded in correspondence of each front and back busbar on both faces of the same cell, progressively realizing an interconnection in series of the front-back type between the cells, from the bottom to the head of the panel, in such a way as to convey all the currents of the string of cells to the back junction box. For example, see the tables of the known prior art (FIGS. 3a-b). Today, with respect to the traditional solutions of cell with two continuous and parallel busbars on each front, more efficient solutions of surface metallization are available on the market, which are based on a greater number of busbars, for example three or four on each front; furthermore, particular improvement solutions are also known with busbars of the discontinuous type, in the form of hatched pads interconnected to each other, which enable a welding of the punctual type which is more economical in the production process and also solves some known problems, described in the following.

In more detail as to the conventional technologies of electrical interconnection of the cells, it has been observed that the welding of an interconnecting ribbon on the front busbar of the cell and on the corresponding back busbar of the adjacent cell, is one of the most delicate and complicated phases of the whole assembly process of a photovoltaic panel with H-type architecture; such a production phase is industrially carried out by means of automatic devices of medium complexity, called automatic stringers, which have some known problems described in the following. As an alternative to said automatic stringing, today widespread are production systems in which such welding is carried out manually with a consequent waste of time, inaccuracy or poor repeatability and a low level of quality of the final result.

Among the known solutions intended to solve the problems of interconnection of the cells or to improve the production processes of the panel some innovative solutions of a cell with discontinuous busbars can be pointed out, as for example in US2010000602 (Gray et al.), US2009277491A1 (Nakamura et al.) and WO2012140139 (Von Campe et al.) or even the known solutions of back-contact cells of new generation, which are insulated like conductive pads. Furthermore, as to the cells of the H-type, we would like to recall the technologies of electrical interconnection at high temperature alternative to conventional welding such as induction heating as in EP2607008 (Meisser et al.). In more detail, we recall the use of the conductive adhesives of the type called Electrically Conductive Adhesive or conventionally known by the acronym ECA, which are widely used in the industrial sector of electronics and which also are used in the photovoltaic panels of new generation having back-contact cells, as for example in EP2139050 (Bakker et al.). Furthermore, one should remember the recent solutions of panels with standard front-back-contact cells which are interconnected by means of conductive adhesives; for example, see the solution proposed in US20110048492 (Nishiwaki) where the conductive elements are joined at low temperature with a conductive resin of the soft type which prevents cracks and decreases surface stress on the cell, or see the solution proposed in WO2013048758 (Clark et al.) where the adhesive has a particular composition and a specific transition temperature, or still see the solution as in WO2013110607 (Martini et al.) where the busbars are pre-treated in such a way as to facilitate adhesion. As a further example, one should remember the known solutions of automatic stringers as in WO2013068982 (Knoll et al.) or WO2010031571 (Schartl et al.).

For the purpose of determining the prior art related to the proposed solution a conventional check was made, searching public archives, which has led to find some prior art documents, among which:

D1: ITTV2012A000211 (Baccini et al.)
D2: U.S. Pat. No. 8,253,009 (Reinisch)
D3: WO2010000812 (Merz et al.)
D4: U.S. Pat. No. 8,485,774 (Knoll et al.)
D5: DE102008046327 (Kalmbach et al.)
D6: WO03098704 (Dings et al.)
D7: WO2008145368 (Reinisch et al.)

D1 proposes a plant and a method for the automatic assembly of photovoltaic panels with back-contact cells, said cells being interconnected with adhesives of the ECA type on the back side only, in correspondence of the conductive layer of a particular backsheet which also integrates the encapsulating and the dielectric material; such a backsheet, previously made, is placed horizontally on a tray with the conductive layer facing upwards and with the areas of contacting of the cells already masked in such a way as to allow the laying of the conductive adhesive with automatic drop-by-drop dispensing as well as with the control of the position; then one lays the cells, the upper layer of encapsulating material and the glass, which will then be subjected to conventional rolling.

D2 describes a solar cell connecting apparatus having operating modules, of which a first module is for joining the solar cells and strips together, a second module is for soldering the strips to the solar cells, and a third module is for transporting them through the other modules; the system includes a continuous system for positioning the conductive elements suitable for standard cells as well.

D3 proposes a system and a method for the production of photovoltaic panels with standard cells wherein the handling of the cells is simplified being placed in aligned rows and connected by means of side contacting elements.

D4 describes a high productivity apparatus consisting of a plurality of stringers arranged perpendicularly, or at an acute angle, with respect to the conveyor belt which moves the strings to the central interconnection station where the complete matrix is made, the apparatus being controlled by a camera vision system and managed by the central control system.

D5 proposes a plant and a method for the production of photovoltaic panels which comprises at least one device for the preparation of the support, one device for the pre-assembly of the cells, one device for the positioning of the cross contacts on the substrate, one device for the loading of the pre-assembled cells, one device for the contacting of the cells, one device for closing the circuits of the strings and one device for fixing the components to the supporting glass.

D6 describes a compact station of preparation of the cells with the application of the connecting conductive elements, and it also proposes a following stringing station which is intended to form the complete panels on the transparent glass, the contacting being carried out by welding or by laser without contact.

D7 proposes an assembly station structured with two parallel working levels: an upper level for the cells and a lower level for the transparent glass, the preparation of the cells being separated into two adjacent tracks, which join each other to couple with the underlying glass in a laser welding station, the movement devices being comprised in the overall dimensions of the aligned devices that form the production line.

In conclusion it is reasonable to consider as known:
 a photovoltaic panel of first generation with cells of the standard type called H-type, with front-back contacting, enclosed between two layers of encapsulating material and assembled in a mainly manual way;
 a cell of the standard type with front collection fingers and contacting busbars placed on the front and on the back of the cell which are of the continuous or discontinuous type;
 a stringing system of the standard cells at high temperature with inserted conductive elements which are welded first on one side and then on the other side, turning the cell, or by laser through a transparent glass, or even by induction;
 a stringing system of the standard cells at low temperature with particular conductive adhesives;
 a contacting system of the cells of the back-contact type, directly on a conductive backsheet only on the back side of the cells, by means of drop-by-drop dispensing of ECA adhesive;
 a system and a process for the stringing of standard cells by welding, laser or induction;
Drawbacks In conclusion, we have observed that all the known solutions have drawbacks or anyway some limits.

Generally, in the panels of first generation with cells of crystalline silicon of the standard type, with front-back contacting, it is widely known that the conventional processes of welding of the strings of cells often imply quality problems with a high probability of breaking, high contact resistance and/or variable from one cell to the other and in time, wear of the cells, limited duration in time or due to the weather, thus obtaining a high efficiency loss from the cell to the module, also called cell-to-module loss, which typically reaches absolute values between 2% and 5% of the total conversion efficiency.

In more detail as to the conventional solutions of electrical interconnection of said cells of the standard type, it has been observed that the quality of said interconnection depends in a decisive way on the number and on the shape of said interconnecting ribbons; for the purpose of realizing said interconnection correctly, in fact, it is necessary to continuously interpose between one cell and the other a high number of said conductive elements, which must have such a thickness and width as to allow the transport of all the electric current generated by each cell. In principle it would be desirable, with an equal overall section of said interconnecting ribbons, to provide a high number of said conductive elements, each one being provided with small width and great height for the purpose of reducing the shading on the cell and increasing the collection of the electrical charges generated by photovoltaic effect; however, the width of said interconnecting ribbons is limited by the difficulty of the welding operation which increases when the width decreases and the contact resistance increases. The increase in height of said interconnecting ribbons, too, is limited by the evident technological and physical limits and it also implies greater thicknesses of the front encapsulating layer, with consequent irradiation losses. The maximum number of interconnecting ribbons which can be interposed on the front of each cell is instead limited by the dimensions and by the design of the stringers themselves; to this purpose, it has been found that today it is industrially difficult, and thus limiting, to exceed the number of four or five interconnecting ribbons on each face of the cell. From what has been described above derives a remarkable variability of the contact resistance between said cells and said interconnecting ribbons, which as a consequence is translated into said cell-to-module loss which is variable from one module to the other but which in any case is of a relevant value and negatively affects the quality and performances of the finished product.

A second problem that has been found lies in the need to keep an average high temperature, generally between 200° C. and 300° C., over the whole surface of each of said interconnecting ribbons; in fact, it is well known that such a temperature is critical as to the correct melting of the alloy that covers the conductive element, for the purpose of coupling with the related busbar. Said temperature, in particular, is too high for some constructions of photovoltaic cell such as said hetero junction silicon cells called HIT™ or HJT; such cells, in particular, do not allow during welding to exceed the temperature of about 180° C. because of the particular production processes. In general and in principle, it is also known that the higher the temperature is to which the cells are subjected after the production phase called firing, and especially in the presence of statuses of joint tension as it also occurs during the stringing phase, the greater is the probability that damage to the cell occurs.

A third problem that has been found concerns the need to keep a homogenous temperature on the entire welding surface of said interconnecting ribbons, in order to prevent differences and discontinuities of the contact resistance, this being a characteristic that strongly affects the electrical performances of the whole panel.

A fourth problem that has been found concerns the risk of breaking of the cells; having to transfer a considerable amount of heat, generally by contact, the stringers must make a pressure on the ribbons during the heating that, due to the intrinsic fragility of the solar cells of crystalline silicon and often due to their bending caused by the differential shrinkage between the two opposite faces of the same cell on which different quantities of metal are laid, this is translated into a high probability of breaking of the cells themselves. It is known that this probability varies from one manufacturer to the other, being on average between about 0.5% and 1% of the total of the stringed cells.

A fifth problem that has been found concerns adhesion; in fact, since the ribbon has to adhere as best as possible onto a large surface of the cell, a sufficiently wide area is necessary for the coupling by welding with the ribbon itself; said area must be metallized, forming said busbars, and commonly sintered with the crystalline matrix of the silicon underlying the layer of silicon nitride laid on the surface to make the so-called anti-reflection layer. Therefore, conventional stringing requires that the surface of said busbars is sufficiently large and this is expensive because the metallization material of said busbars is essentially silver; for example, we have observed that this valuable material is generally present in the metallization paste in a percentage on average between 85% and 92% of the total weight of the paste itself.

A sixth problem that has been found in conventional solutions concerns the balancing of the strains and of the deformations between the upper face and the lower face of the cell. During the stringing phase, in fact, weldings are alternatively carried out on both faces of the same cell, for the purpose of enabling the connection between the opposite electrical polarities of adjacent cells. In particular, it has been observed that this operation requires high temperatures, generally included between 200° C. and 300° C., which imply differential thermal deformations between the different materials forming the cells and the ribbons which cause residual tensions in these materials; in fact, it is known that such tensions can jeopardize the integrity of the cells during the stringing phase, during rolling or even during operation. For the purpose of minimizing said strains and said deformations it is desirable to balance exactly what is made on the front face with what occurs on the back face of the same cell, however said balancing being of difficult realization, the higher the temperature is to which the stringed cell is subjected.

Furthermore, as to the assembly process of a panel with conventional stringing, it has been observed that the cells and said interconnecting ribbons need extreme precision and regularity in laying in order to be able to be correctly welded in electrical series; such components, moreover, are interposed between two layers of encapsulating material, like the known thermoplastic materials of the EVA type or polyolefins, and also enclosed between the front glass and said backsheet, for the purpose of prearranging the multi-layer panel for the final operation of rolling in the furnace, which occurs at about 150° C. In particular, since in most cases such operations are performed manually, it is well known that they involve a large use of workforce, time and the risk of faults with frequent and expensive reprocessing. Moreover, for the purpose of ensuring that the cells and said ribbons do not undergo relative translations during the whole process described, damaging the appearance and the functionality of the strings, said components from time to time are fixed with adhesive tapes applied manually, which are an additional cost. Therefore, it has been observed that the repeatability, the regularity and the guarantee of the quality of the finished product are strongly affected by the manual skills and by the experience of the many operators who carry out the various assembly phases.

Said problems of interconnection of the cells and of assembly are often the cause of defective panels with consequent economic damage due to wastes or reprocessing, if the faults are found during production; in particular, it is known that the faults concerning the electrical contacting of the cells are particularly serious as they are difficult to find, if not after the final rolling phase, that is to say, when the panel is already damaged and unrecoverable. Furthermore, we have observed that the residual tensions inside the cells caused by the conventional stringing processes can sometimes lead to the breaking of the cell itself, said breaking also being able to occur long after the installation in operation of the panel.

Furthermore, as to the known solutions of panels with a back-contact architecture, it has been observed that the innovative integrated and automated solutions of horizontal assembly today are linked to cells which are still not widespread on the market, not being instead suitable for the conventional cells of the H-type which must be welded on the front and on the back in correspondence of said busbars.

Hence the need for the companies of the sector to find solutions which are more effective with respect to the existing solutions; the aim of the present invention is also to solve the described drawbacks.

BRIEF SUMMARY OF THE INVENTION

This and other aims are achieved by the present invention according to the characteristics as in the appended claims, solving the arising problems by means of a plant (10) and a system for the automatic horizontal assembly of photovoltaic panels (30) with solar cells (300-1) of crystalline silicon with front-back contacting, of the type called H-type, the contacting being carried out at a temperature lower than 150° C. also with the pre-fixing of conductive elements on the encapsulating layer; the invention solves the main problems of the conventional stringing systems and also enables a high production capacity with precision of positioning of the components. The plant (10) is made up of single workstations (100A-I) of the modular type which are sequentially placed in linear series, and which are individually equipped according to the specific working process, being adjacent and laterally open to be crossed by the conveying line (110) of the trays (109) containing the panels being worked; after the automatic assembly in said plant (10), the panels are ready to be rolled in conventional furnaces.

Aims

In this way by the considerable creative contribution the effect of which has allowed to reach a considerable technical progress, some aims and advantages are achieved solving the main drawbacks pointed out.

A first aim of the invention was to prevent the occurrence of the faults generally connected with the assembly process and particularly to the electrical connection of the cells, eliminating the causes of wastes or reprocessing due to the manual working processes and to the relative translations between the components.

A second aim was to realize an electrical connection in series between cells of the front-back type called H-type with a lower working temperature with respect to the conventional techniques, being particularly realized by measuring and laying limited amounts of conductive adhesive interposed between cells and ribbons to replace the traditional stringers, never exceeding the maximum temperature present inside the roller which is generally of 150° C. With respect to the conventional welding processes, where the temperature is generally between 200° C. and 300° C., the use of reduced temperatures determines significant advantages for the panel and for the materials contained in it because the strains and the residual tensions arising inside the ribbons are considerably lower. In particular, it has been observed that this advantage occurs also for a long time after the assembly phase, extending to the whole operational life of the panel which is thus exposed to lower probabilities of breaking of the cells. Moreover, process temperatures lower than 150° C. allow to use photovoltaic cells which otherwise do not bear high temperatures due to their structural nature such as said cells of the HIT™ or HJT type.

A third aim was to obtain a significant saving of the materials used such as the low-melting alloys applied on the surfaces of the ribbons or part of the silver paste laid on the busbars of the cells; furthermore, the fingers are reduced and the use of the pre-fixing adhesive tapes is completely eliminated.

A fourth aim was to enable the industrial production of photovoltaic panels with cells of the front-back type in a more automated way with respect to the traditional processes by considerably reducing the manual interventions during the phases prior to the rolling and with particular reference to a faster and more precise front-back contacting of the cells, also with a greater guarantee of quality of the product.

A fifth aim, linked to the previous one, was to integrate a control system of the automatic type which checks each working process carried out during the assembly process, thus increasing the overall level of quality of production and the repeatability of the product.

A sixth aim was to realize an assembly plant with operating stations of the modular type, having a regular geometric shape, compact, repeatable, easy to be combined, each of them being easily equippable according to the specific working process and with low economic investments; furthermore, said assembly plant occupies a small surface area.

An additional aim was to provide high production flexibility, enabling easy changes in the configuration of the panel, for example in the quantity, shape, size and arrangement of the cells; furthermore, it is possible to use cells with front-back contacting of the H-type characterised by any design of the surface metallization, both with conventional busbars of the continuous type and, advantageously, of the discontinuous type.

In particular, the automatic production plant and the assembly method proposed by the invention have high production capacity and high precision and accuracy of positioning and fixing of the components, in such a way that the industrial production of photovoltaic panels is considerably more economical, repeatable, safe, with considerable technical progress and benefits.

These and other advantages will appear from the following detailed description of some preferred embodiments, with the aid of the schematic drawings enclosed whose details of execution are not to be considered limitative but only illustrative.

BRIEF DESCRIPTION OF THE SEVERAL VIEWS OF THE DRAWINGS

FIGS. 8a and 8b show in detail the operating phases (F1-9) as in said FIG. 7, with the related sub-phases and check phases, according to the preferred embodiment of the invention.

FIGS. 9a-i show the panel being worked: preliminary preparation of the backsheet with holes (9a), fixing of the conductive inserts (9b), superimposition of the encapsulating material with pre-cut window (9c); assembly of the components in the plant: lifting of the window (9d) as in phase F2, application of the head cross ribbons (9e) as in phase F2, application of the interconnecting ribbons (90 head and bottom row in an alternated series as in phase F3, laying and pre-fixing of the first row of cells (9g) onto said interconnecting ribbons upon laying of ECA as in phases F4-5, measured dispensing of ECA in correspondence of the busbars (9h) as in phases F4-5, repetition of the laying and of the fixing by rows in an alternated series of cells with interconnecting ribbons (9i) until the completion of all the strings of the panel as in phases F4-5.

DETAILED DESCRIPTION OF THE INVENTION

The present invention describes an innovative plant (10) (FIGS. 5a-b, 6a-d) with modular operating stations (100A-I) for the automatic assembly of photovoltaic panels (30) with a conventional architecture, with front-back-contact solar cells of the H-type; the invention, therefore, proposes an innovative horizontal assembly system which is based on a particular production method (20) (FIGS. 7, 8a-b) optimized according to said plant (10), solving the main problems connected to the conventional systems of assembly and stringing of the cells and also enabling high production capacity, with great precision of positioning and fixing of the components. In particular, the invention provides that said cells are connected at low temperature on both sides, in an automated way, by means of limited amounts of an electrically conductive adhesive placed punctually according to the procedure in use in the electronic industry; moreover, it is provided that said cells and all the contacting elements are pre-fixed on the lower layer of encapsulating material contextually to positioning, in order to prevent relative translations of the components before the final rolling.

Figure 1A:
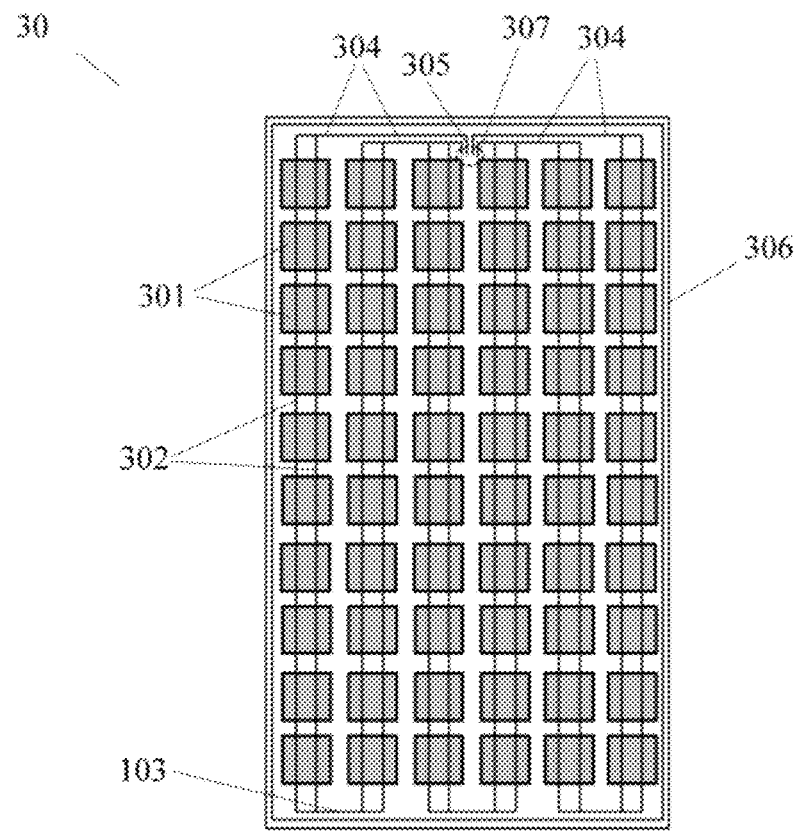
FIG. 1a shows, in a front schematic view, a photovoltaic panel of first generation, with standard front-back-contact cells of crystalline silicon of the H-type, according to the prior art.
Figure 1B:
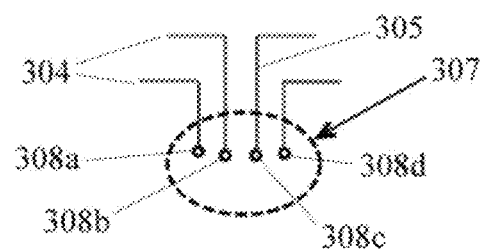
FIG. 1b is an enlarged detail of panel of FIG. 1a highlighting the zone of connection of the front string terminals to the back junction box, according to the prior art.
Figure 2:
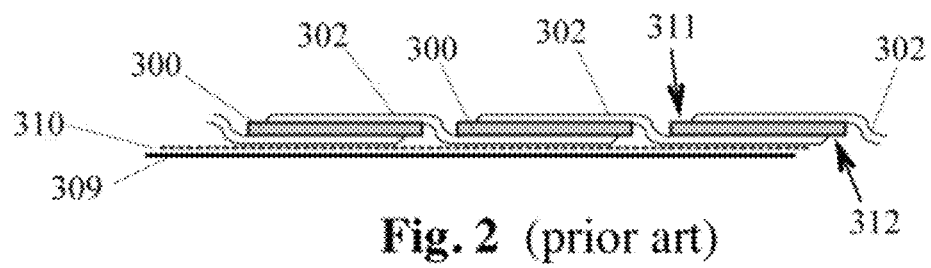
FIG. 2 shows, in a schematic sectional view, the supporting backsheet with the first layer of encapsulating material and photovoltaic cells of the standard type that are electrically connected in string in the front-back mode by means of the related interconnecting ribbons, according to the prior art.

The photovoltaic panels (30) which can be made by the plant (10) and method (20) according to the invention have a conventional architecture with front-back-contact solar cells of crystalline silicon, which are also called standard or first generation cells. Starting from the back side not exposed to the sun, each panel (30) comprises the following components: a supporting backsheet (309); a first layer of encapsulating material (310); said solar cells (300-1) of silicon which, in particular, can be of the monocrystalline type, polycrystalline type or even of hybrid technology such as on said HIT™ or HJT cells; a plurality of longitudinal interconnecting ribbons (302) for connecting in series said cells, the front with the back of the adjacent cell, in correspondence of the related busbars; the cross ribbons at the head (304) and at the bottom (303) of the panel, for collecting the string currents in correspondence of the zone of connection (305, 307) to the back junction box, through passing-through conductive inserts (308a-d); a second layer of encapsulating material which frontally encloses cells and connections; a front glass; a rigid frame (306) which encloses the perimeter of the panel (30); the back junction box. For example see the prior art tables (FIGS. 1, 2).

Figure 3A:
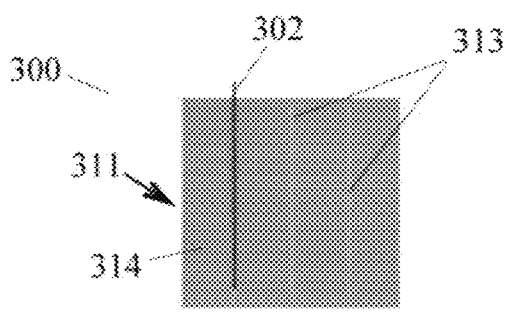
FIGS. 3a-b orthogonally show the front (FIG. 3a) and the back (FIG. 3b) of a standard H-type cell of crystalline silicon with continuous and parallel busbars, according to the prior art.
Figure 3B:
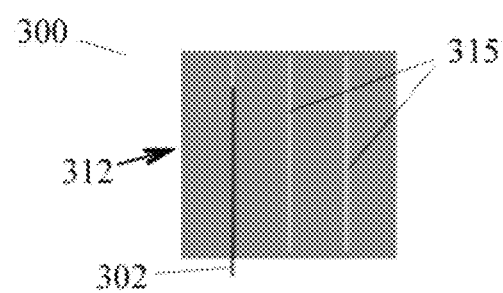

The invention provides the use of any conventional and known solar cell of the standard type, with front-back contacting on busbars. For example, it is suitable to use the cells with continuous and parallel busbars (313, 315) on both sides (311, 302) such as the known cells of the H-type (300), see the prior art tables (FIGS. 3a-b); as an alternative, however, it is preferable to use cells with busbars of the discontinuous type as the contacting of the punctual type is just as suitable for connections with conductive adhesives laid in small amounts, however providing a great saving in the use of silver paste on the front of the cell and said saving sometimes being equal to or higher than 30% of the generally used amount. It has been observed that such a cell configuration allows to obtain greater efficiency during production also with an extremely high quality of the finished product, particularly in the case of large production volumes. To this purpose, therefore, the invention proposes a particular family of configurations of cell (301) particularly advantageous for the assembly by the proposed plant

(10) and assembly system, having a plurality of discontinuous busbars (316a, 318a) shaped as small conductive pads, aligned to form a hatched busbar.

In more detail, said discontinuous busbars (316a, 318a) consist of aligned and insulated conductive pads (316b, 318b), each pad preferably being of a regular geometric shape of the circular, elliptic, square or rectangular type and having, according to said shape, the diameter or the major axis or the greater side between 0.5 and 1.2 mm. Said conductive pads (316b, 318b) of each busbar (316a, 318a) are placed at a reciprocal distance between 5 mm and 15 mm, measured on the external edge of the pad, and are electrically connected to each other by a pair of longitudinal fingers (317b) having a width between 50 microns and 120 microns, measured after the production phase called firing, and a height between 10 microns and 20 microns in such a way as to cross and transversely connect the cross fingers (317a). Said conductive pads (316b, 318b) of each busbar (316a, 318a) are therefore individually joined and connected with ECA to one interconnecting ribbon (312) only in correspondence of said busbar formed by the row of aligned pads (316b, 318b); said discontinuous busbars (316a, 318a) being in a number between 6 and 15 on each face (311-2) of the cell (301), and preferably between 7 and 10.

Therefore, the following English terms which are commonly used in the photovoltaic sector in the following of the description have the meanings specified as follows:
- backsheet is the supporting and closing sheet placed at the back of the panel;
- busbars are the metallized contacting elements for the collection of the currents frontally picked-up by the fingers, being sintered at high temperature, for example between 800 and the 970° C., on both faces of the cell and of any structure both continuous and discontinuous;
- cross ribbons are the electrically conductive cross elements in the form of ribbons which convey all the string currents in correspondence of the head and of the bottom of the panel, towards the junction box;
- dispensing is the automatic technology of distribution and punctual and calibrated laying of small amounts of ECA, generally in single drops, in use in the electronic industry;
- ECA, the English acronym for electric conductive adhesive, is an electrically conductive adhesive of the type used in the electronic sector which is applied punctually in drops with automatic devices and in precisely measured amounts. For example, for the purposes of the present invention it is particularly suitable to use an adhesive based for example on thermosetting epoxy resin normally charged from 85% to 92% with conductive metal powder which can be variously made up of metals (such as Ag, Cu, Sn, Bi and others) or metal alloys;
- fingers are the metallized thin linear elements which frontally pick up the currents of electrons generated in the silicon cell by photovoltaic effect;
- interconnecting ribbons are the electrically conductive longitudinal elements shaped like thin ribbons which interconnect the front of one cell with the back of the adjacent cell; for the purpose of stability during movements, the invention provides that said elements are connected with adhesives of the ECA type also being pre-fixed along with the cells on the underlying layer of encapsulating material.

The invention provides, in particular, that the electrical connections between said busbars and said interconnecting ribbons are made at low temperature applying punctually limited amounts of ECA by means of automatic dispensers, according to the known technology called dispensing or jetting, the measuring and the punctual laying of said ECA being carried out with precision in an automatic way assisted by artificial vision systems. Such a solution completely replaces the traditional stringers that, for the standard front-back-contact cells, generally provide the welding of the conductive ribbons or provide similar high-temperature techniques, such as induction with welding paste, which are disadvantageous as described above.

In more detail, said ECA is interposed, in measured drops (321), between the surfaces to be contacted such as the front surface of said cells (311) in correspondence of the busbars (313, 316a) and of the interconnecting ribbons (302); it is known that this technology distinguishes the phase of dispensing and laying of the adhesive from the following phase of activation of the adhesive component with the concomitant final hardening. The invention provides that said hardening phase which definitively fixes the cells and ribbons occurs after the assembly of the panel (30), during the conventional rolling process, that is to say, outside the proposed plant (10), although carrying out said activation already during the assembly, that is to say, inside said plant (10) with localised heating, as described in the following. In particular, it is observed that in rolling the temperature of 150° C. is generally not exceeded, that is to say, a value about 50° C.–150° C. lower with respect to the conventional and known welding systems; with ECA and conventional rolling, therefore, said interconnecting ribbons can have a simplified structure and be more economical, the typical coating with low-melting alloys such as the known Sn—Ag—Pb alloy or other similar alloys not being necessary.

By assembling front-back-contact cells of the H-type, for the purpose of enabling the interconnection without relative translation of the components and with a high level of industrial automation, it is particularly provided to carry out during assembly the pre-fixing of cells (300-1) and interconnecting ribbons (302) on the underlying layer of encapsulating material (310), also with the partial activation of said ECA. Said pre-fixing and said activation are obtained concomitantly and simultaneously inside the plant (10) by means of selective heating from the top, that is to say, being localised frontally only on some parts of said cells and the related ribbons, jointly to the underlying encapsulating polymeric material. In particular, it is observed that said selective heating has a double function, adhesive on the encapsulating material and of activation of the polymerization of the resin which composes the conductive adhesive; in this way the ribbons and/or the groups of cells are fixed to their substrate, preventing any translation or rotation in the following processing steps until the rolling of the whole module. Said operation of selective heating is carried out in two different moments: the first time it occurs concomitantly to, or immediately after, the laying of the interconnecting ribbons (302) to fix the latter to the layer of encapsulating material (310); the second time it occurs concomitantly to, or immediately after, the laying of said cells (300-1) in the final position above said interconnecting ribbons (302), and in particular after the laying of the ECA in the suitable contact areas between the ribbons (302) and cells.

In more detail, said selective heating can be easily carried out by means of heating sources frontally arranged at a short distance from the cell or from the ribbons or descending in proximity to the contact; heating means of industrial use such as infrared lamps or other wavelength lamps, or heating electrical resistors, are suitable for the purposes of the invention. Such sources are selected and sized in such a way that, by acting from the top downwards on distinct portions of said components at a distance up to 40 mm, temperatures lower than 150° C. and in any case such as to activate the adhesion to the underlying encapsulating material (309) are reached on said elements (300-5). Therefore, the invention provides that this operation is fast; it has been observed, for example, that by using lamps having a power between 1 kW and 4.5 kW at a distance of about 40 mm from the surface of the cells, or even using electrical resistors or inductors, in such a way as to obtain a temperature between 80° C. and 130° C. in proximity to the surface of the cells and of the ribbons, the pre-set aims are achieved in a time between 0.5 and 7 seconds. In the preferred embodiment, for example, said pre-fixing is carried out with infrared lamps of about 4 kW at a distance of about 20 mm from the cells for a duration of about 5 seconds, obtaining a temperature of about 100° C. on the encapsulating material and of about 120° C. on the cells frontally, in correspondence of the ECA interposed between the ribbons and the cells.

The innovative plant (10) (FIGS. 5a-b, 6a-d) for the automatic assembly of the panels (30) is substantially an in-line plant made up of single workstations (100A-I) of the modular type which are laterally adjacent to each other, in correspondence of the long side, each station (100) being individually shaped as a right-angled parallelepiped of standard shape and size. Laterally, said stations (100) have openings (107) in such a way as to be horizontally crossed by the conveying line (110) with recirculation of trays (109) which transports along the working surface (111) each tray containing the panel being worked to return to a lower level (112), under said working surface, to substantially form a continuous loop production line, also called vertical carousel. In the preferred embodiment, which is intended to limit as much as possible the spaces of the plant (10), said workstations (100A-I) are modular in the form of a standard parallelepiped having the same height, the same short side and the long side in different versions, for example a base version (100B-E, H-I) corresponding to the width of said conveying line (110) of the tray (109) increased by the space for the loading of the electrically conductive components, for example the cells, and a second version (100A, F, G) which also includes an extension in the form of a side compartment (108) for the automated loading of the long components, such as the backsheet, the front encapsulating layer or the glass.

Figure 5A:
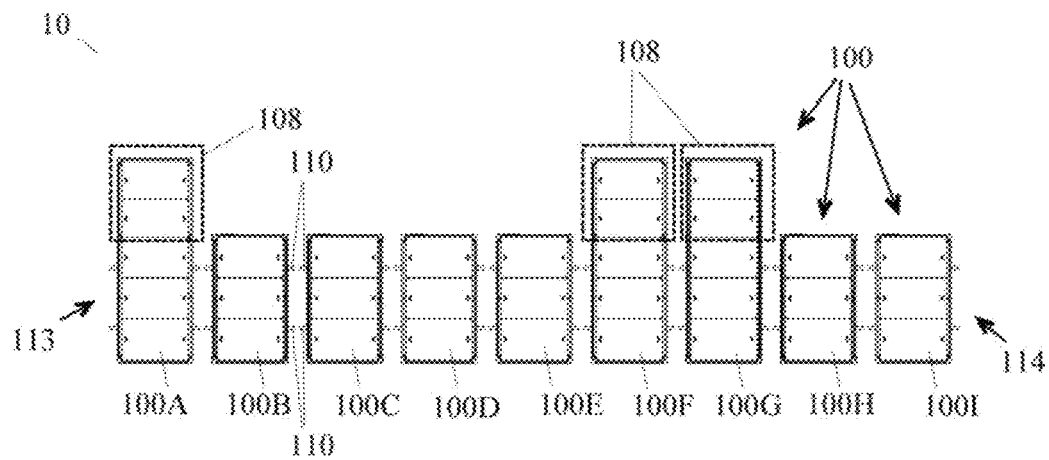
FIGS. 5a and 5b show, in orthogonal views from the top (5a) and from the side (5b) in section, the plant according to the invention which is made up of adjacent workstations, of the modular type.
Figure 5B:
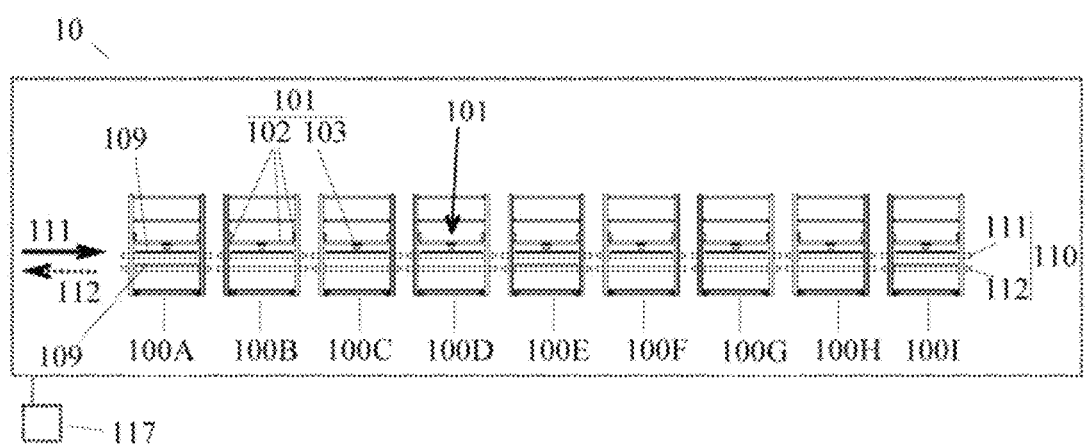
Figure 6A:
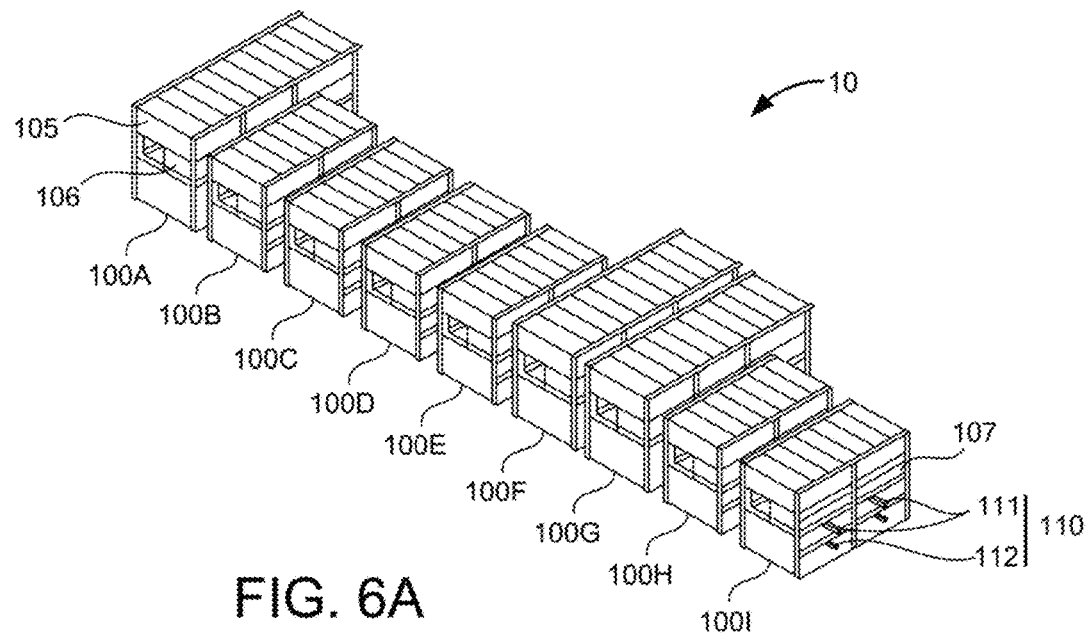
FIGS. 6a, 6b and 6c show, in axonometric views, the plant according to the invention where the modular workstations are shown with the protection panels (6a) and without said panels (6b-c) to facilitate the understanding of the inside, the FIG. 6c being an enlarged detail referring to the single station highlighting the conveying-working means with Cartesian robot.
Figure 6B:
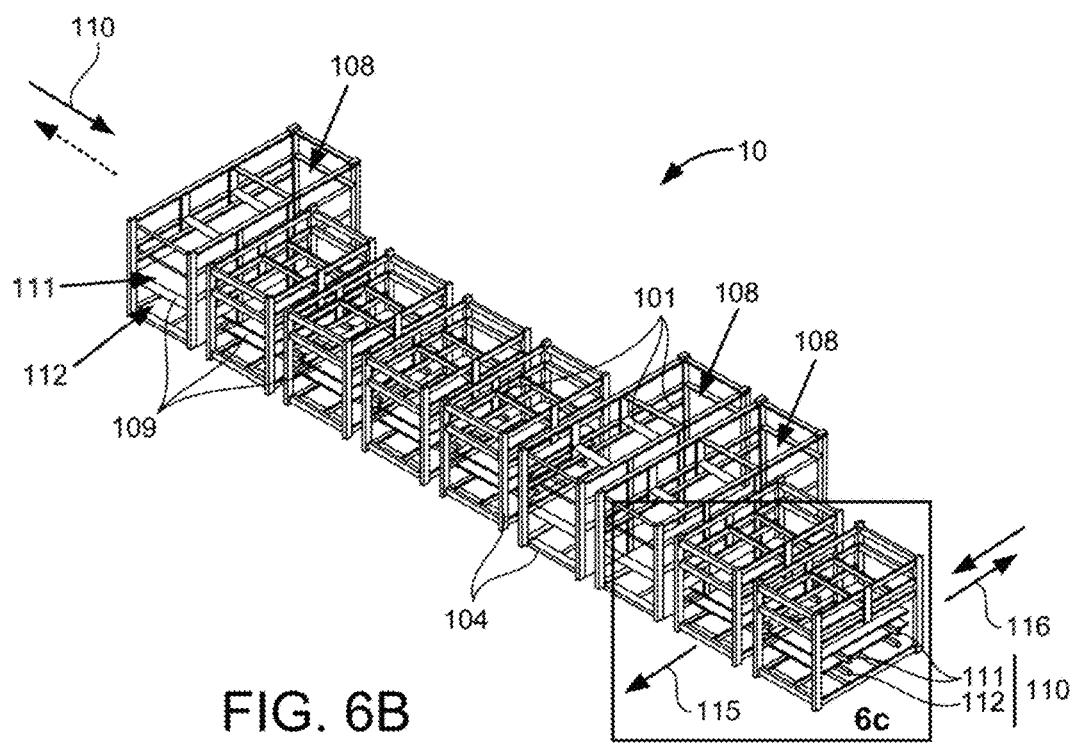
Figure 6C:
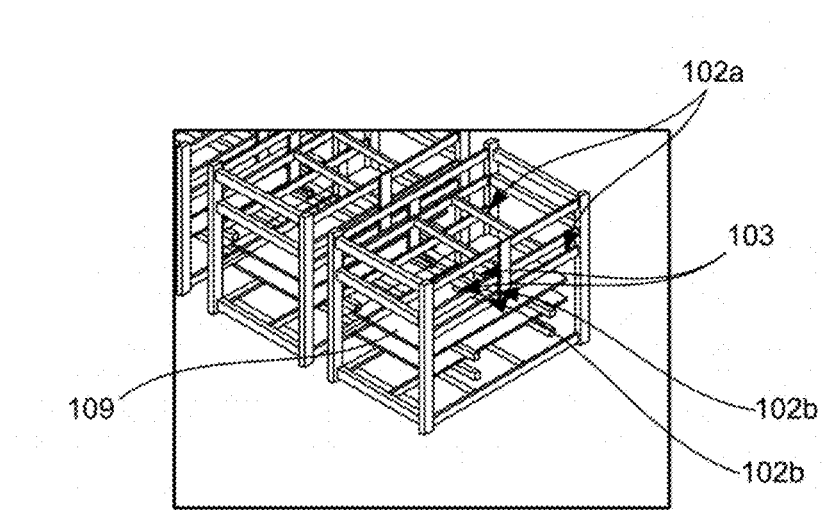
Figure 6D:
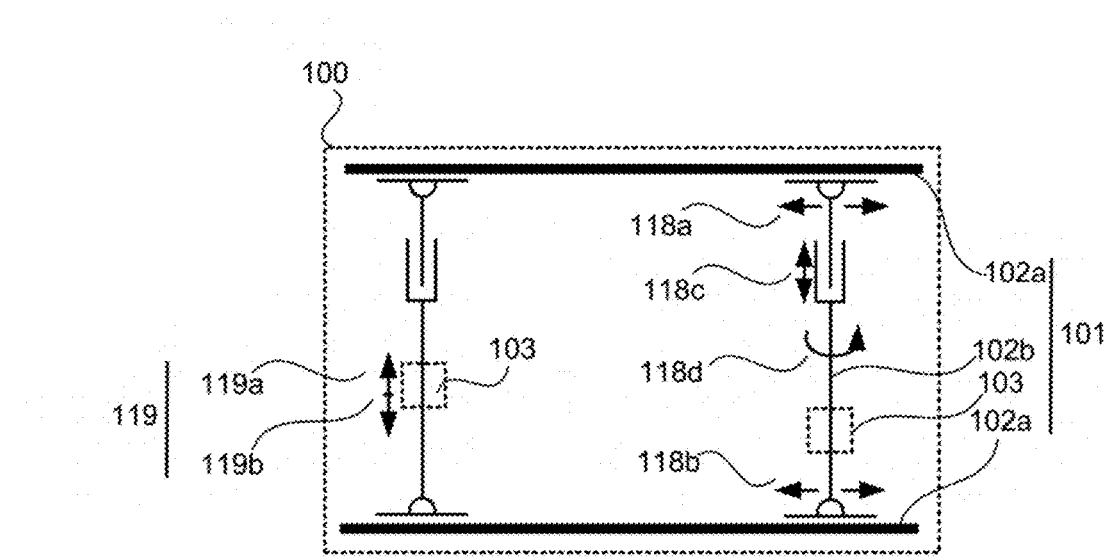
FIG. 6d shows, in a schematic view from the top, the kinematic system of the conveying-working means with Cartesian robot as is provided by the invention, as in FIGS. 5b and 6c).

Each workstation (100) is made up of a load-bearing structure (104), preferably of the frame type, with opaque panels (105) of protection and with transparent plates (106) for the visual controls. Each station includes its own portion constituting said conveying line (110) and also, in particular, it comprises at least one integrated system of conveying and working of the components of the type called Cartesian robot (101) with electronic control, preferably managed by means of the same logic control unit (117) which supervises the whole plant (10) (FIG. 5b). Said robot (101) is preferably made up of a Cartesian structure (102) with moving parts and at least one mobile head (103) intended to be equipped from time to time according to the specific working process required by the workstation; said mobile head (103), in fact, is from time to time equipped with means for the pneumatic loading and/or for the electrical contacting with ECA and/or for the pre-fixing by localised heating, in such a way as to enable the horizontal assembly of all the components, by progressive superimpositions on the backsheet (309, 310) which is loaded on the tray (109) with the encapsulating material (310) facing upwards, forming a panel (30) ready for rolling. In more detail, said Cartesian robot (101) has a structure (102) with roto-translation (118a-d) of the type with mobile gantry (102b) on power-operated rails (102a) with at least one mobile head (103) equipped to carry out the working processes on the working surface (111, 119a-b) (FIGS. 5b, 6c-d); in particular, said mobile gantry (102b) is constrained to said power-operated rails (102a) on hinge-sliding blocks independent in the movement and coordinated with respect to each other (118a-b) in such a way as to enable the horizontal translation and also the rotation (118d) around the vertical axis, said gantry (102b) being of the telescopic type (118c) and this solution (118a-d) being extremely advantageous for the purpose of the automatic alignments. The kinematic system of said robot (101) is completed by said mobile head (103) which is power-operated at least to translate longitudinally (119a), along the gantry, and also to operate vertically (119b) (FIG. 6d).

In more detail, it is provided that each workstation (100A-I) is individually equipped to carry out different working processes in correspondence of the particular phase (F1-9) required by the assembly method (20), each phase being substantially corresponding to each workstation (100A-I) sequentially placed in series, being adjacent and joined by means of said conveying line (110-2) through said openings (107), in such a way as to allow a plurality of identical trays (109), containing the panels during the assembly phases, to cross all the stations in a continuous way. The trays, therefore, proceed on said line (110) made up of the series of conveyor belts of each station, being opposite, rectilinear and horizontal and intended to optimize the paths and eliminate the superfluous sections, to return below when assembly has been completed, with loop recirculation (111-2). On each tray the sequentially following operation is carried out from time to time, at the corresponding station of the plant (10); in some cases, said operation is repeated several times, as it occurs for the measured dispensing of ECA or for the laying and the interconnection of the cells (300-1) that are progressively arranged in parallel rows, in such a way as to perform each operation in the shortest time possible and with the shortest path possible. In correspondence of each station (100), therefore, there is the automatic check of the relative operation performed. The panels obtained by the plant (10) and the system according the invention are advantageously assembled and checked, ready to be inserted into the traditional rolling furnaces.

To this purpose, said series of operating stations (100A-I) is configured in a linear sequence according to a conveying line (110-2) of the carousel type with recirculation of trays (109), which crosses horizontally with a rectilinear path the adjacent stations at a lower level in the form of a loop after the unloading of the panel, comprising optoelectronic control devices of the type preferably in correspondence of each operating station, in such a way as to check the correctness of the working processes carried out; said control device enabling the working or the simple transit of said tray in the following station by comparison of the actual status with a pre-set status.

Figure 7:
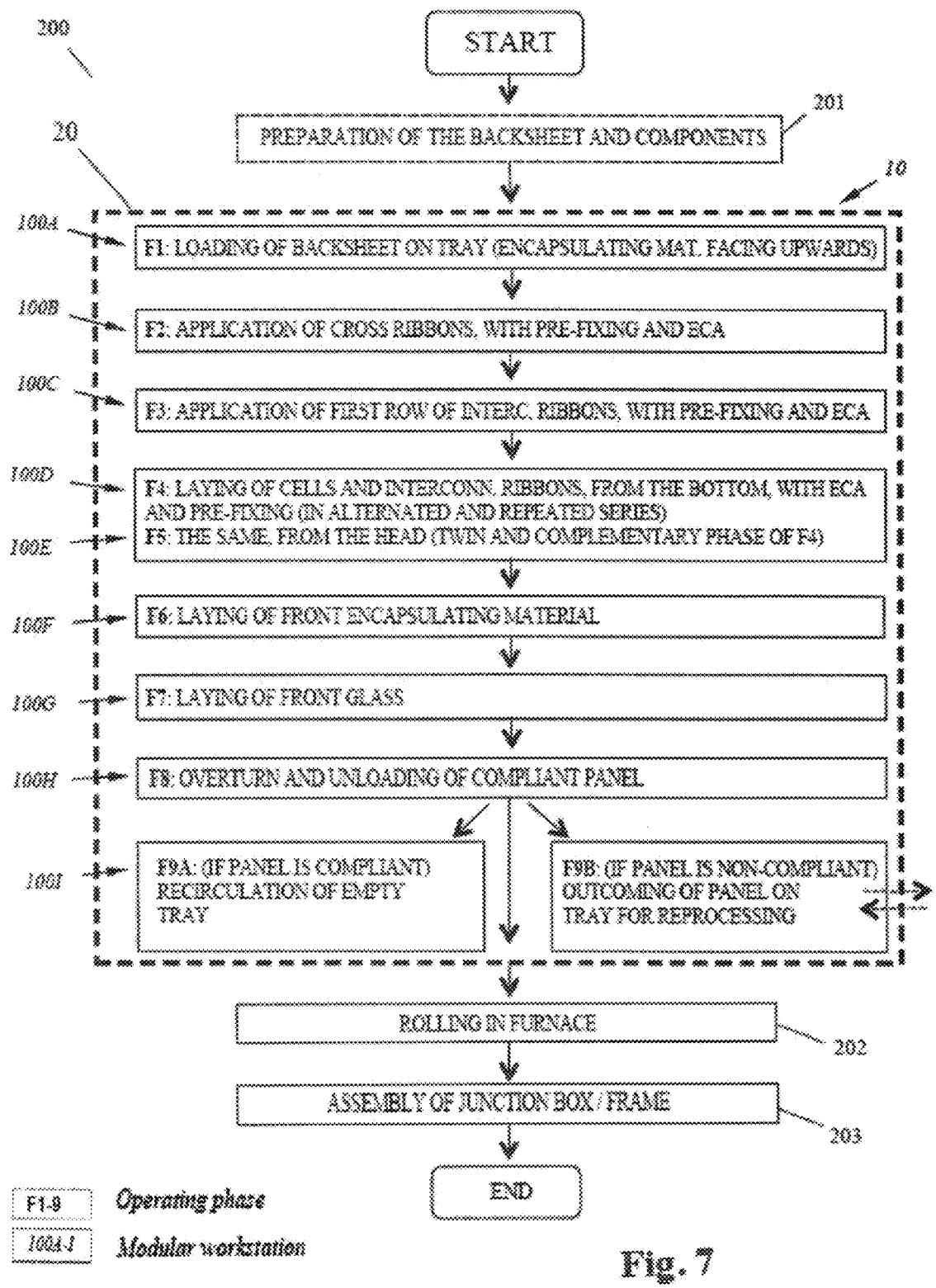
FIG. 7 is a simplified diagram of the whole production process of a photovoltaic panel where the assembly of the components is carried out in an automatic way by means of the plant proposed by the invention, according to an assembly method that provides operating phases (F1-9) in a logic sequence being referred to the single workstations of the plant as in FIGS. 5a-b, 6a-b.
Figure 8A:

In more detail as to the preferential but not exclusive embodiment of the invention, said plant (10) for the automatic assembly of photovoltaic panels (30) consists of a production line with workstations (100) of the modular type sequentially arranged to progressively assemble the panel, each station (100A-I) being equipped to carry out a specific operating phase (F1-9) according to the proposed automatic assembly system. Said plant (10), comprising (FIGS. 5a-b, 6a-d):

a first operating station (100A) including means for the transfer and locking of the tray (109) and means for the loading of the backsheet (309), of the Cartesian robot type with vacuum; the backsheet is already arranged with the encapsulating layer (310) and passing-through conductive inserts (308 *a-d*) for the purpose of the following connection to the back junction box, after rolling. The backsheet is loaded onto an empty tray (109) with the encapsulating material facing upwards. Said tray may be provided with prior art pneumatic and/or mechanical devices intended for the holding of the backsheet in such a way as to prevent its movement during the operating phases inside the various workstations. Said first station, with reference to the operating phase (F1, F1.0-1.1) (FIGS. 7, 8*a*, 9*a-d*);

a control device consisting of cameras and vision software, particularly intended to check the operations performed and calibrate movements. Said device, with reference to the sub-phase of check (FV1) (FIG. 8*a*);

a second operating station (100B) including means for the transfer and locking of the tray and means for the laying and pre-fixing of the head and bottom cross ribbons, upon opening of the window (320) in the encapsulating material (310), also with means for the measured dispensing of ECA in correspondence of the conductive inserts (308*a-d*). Said second station with reference to the operating phases (F2, F2.0-2.7) (FIGS. 7, 8*a*, 9*c-e*);

a control device consisting of cameras and vision software, particularly intended to check the operations performed and calibrate movements. Said device, with reference to the sub-phase of check (FV2) (FIG. 8*a*);

a third station (100C) including means for the transfer and locking of the tray and means for the laying and pre-fixing of the first line of interconnecting ribbons (302) near the head (304) and bottom cross ribbons (303), also with means for the measured dispensing of ECA. Said third station with reference to the operating phases (F3, F3.0-3.6) (FIGS. 7, 8*a*, 0;

a control device consisting of cameras and vision software, particularly intended to check the operations performed and calibrate movements. Said device, with reference to the sub-phase of check (FV3) (FIG. 8*a*);

a fourth station (100D) including means for the transfer and locking of the tray and means for the laying and pre-fixing of the pre-oriented cells (300-1), one row at a time, to progressively form alternated strings of cells, with means for the measured dispensing of ECA, being first laid on the first row of interconnecting ribbons (302) and then on the front surface of the cells to subsequently connect the ribbons (302). Such operations can be repeated several times in said fourth station to complete the whole covering of the backsheet; however, for the purpose of shortening the cycle time and balance the crossing times, such operations can be repeated simultaneously on several twin stations arranged in line, to complete in sequence different and complementary zones of the same backsheet. In the preferential but not exclusive configuration described herein, the invention provides a subdivision on two twin stations: in this case said fourth operating station (100D) lays and fixes the cells with the related interconnecting ribbons starting from the bottom cross ribbons (303) covering with alternated strings of cells half of the surface. Said fourth station, with reference to the operating phases (F4, F4.0-4.7) (FIGS. 7, 8*a*, 9*g-i*);

a control device consisting of cameras and vision software, particularly intended to check the operations performed and calibrate movements. Said device, with reference to the sub-phase of check (FV4) (FIG. 8*a*);

an optional fifth station (100E), the twin of the previous fourth station, which realizes the complementary strings of cells starting from the head cross ribbons (304). Said fifth station, with reference to the operating phases (F5, F5.0-5.7) (FIGS. 7, 8*b*, 9*g-i*);

a control device consisting of cameras and vision software, particularly intended to check the operations performed and calibrate movements also with the check of the complete assembly of cells and ribbons. Said device, with reference to the sub-phase of check (FV5) (FIG. 8*b*);

a sixth station (100F) including means for the transfer and locking of the tray and means for the loading of the layer of encapsulating material over the cells and the ribbons previously placed and pre-fixed. Said sixth station, with reference to the operating phases (F6, F6.0-6.3) (FIGS. 7, 8*b*);

a control device consisting of cameras and vision software, particularly intended to check the operations performed and calibrate movements. Said device, with reference to the sub-phase of check (FV6) (FIG. 8*b*);

a seventh station (100G) including means for the transfer and locking of the tray and means for the loading of the front glass, to obtain the assembled panel (30). Said seventh station, with reference to the operating phases (F7, F7.0-7.1) (FIGS. 7, 8*b*);

a control device consisting of cameras and vision software, particularly intended to check the operations performed and calibrate movements. Said device, with reference to the sub-phase of check (FV7) (FIG. 8*b*);

an eighth station (100H) including means for the transfer and locking of the tray and means for its overturn along with the panel, turning the glass downwards in a position suitable for the outcoming on the belt, towards the rolling furnace, also with means for the release of the tray from the panel and for the counter-overturn of the same tray made empty. Said eighth station, with reference to the operating phases (F8, F8.0-8.2) (FIGS. 7, 8*b*);

a ninth station (100I) including means for the recirculation and for the return onto a lower sliding level of the tray made empty towards the first station (100A). Said ninth station, with reference to the operating phases (F9A, F9A.0-9A.1) (FIGS. 7, 8*b*); said ninth station (100I) also includes means for enabling: the extraction of the tray with the non-compliant panel for possible reprocessing, or to reinsert the tray containing the reprocessed product, or also to reinsert an empty tray. Should at least one of said control devices between the previous stations give a negative result about the correctness of the operation performed, said ninth station is reached directly without said overturn of the tray, that is to say, enabling the simple transit in the intermediate stations. Said ninth station, with reference to the operating phases (F9B, F9B.0-9B.2) (FIGS. 7, 8*b*);

a main conveying line (110) with recirculation of trays (109), of the type with conveyor belts included in each station, with a total loop path which crosses said stations (100A-I) horizontally in a straight line and returns to a lower level (112) with respect to the working surface (111), always within the dimensions of the plant (10). The circulation can be indifferently in one direction or in the opposite one according to the cycle of sequence of the operations provided; the line, in fact, can work indifferently with a flow of the trays from right to left or vice-versa without particular arrangements or changes;

a logic control unit (117), programmable, of the PLC type which supervises the whole plant in an integrated way.

Said plant (10,100A-I) therefore allows, according to the industrial production choices, to assemble the panel (30) indifferently starting from a backsheet provided with encapsulating material, as described above, or as an alternative starting from the front glass on which a layer of encapsulating material is laid, then one carries out said application sequence with head and bottom cross ribbons, first row of interconnecting ribbons, the cells with the related interconnecting ribbons in alternated series repeated until the completion with the final interconnecting ribbons, and on which one places the back encapsulating material and a backsheet provided with conductive inserts, which connect to said head cross ribbons; in that case, the overturn before rolling is not necessary. Said plant also allows, according to the industrial production choices, to increase or reduce the number of twin stations (100D-E) for the purpose of adapting to the required productivity, or it also allows to change the sequence of the operations in said twin stations.

In more detail as to said movement system (110) with recirculation of the trays (109), a configuration is preferably provided, which comprises: a first transport path preferably of the conveyor belt type which horizontally moves the trays from one station to the other on the working surface (111) consecutively from the first one (100A) to the last one (100I); a programmable logic control unit (117), of the PLC type, also integrated to the whole plant, which supervises the overall movement of each tray, for example being called by the downstream station (100I) when this has completed its operation; a descender device which from time to time lowers each tray which reaches the end of the line (114); a second transport path on the recirculation surface (112) of the conveyor belt or roller conveyor type which horizontally, but on a lower level than the first one, moves the trays from the last station (100I) to the first station (100A); a lifter device which lifts to the level of the first transport path from time to time each tray which reaches the start of the line.

Figure 9A:
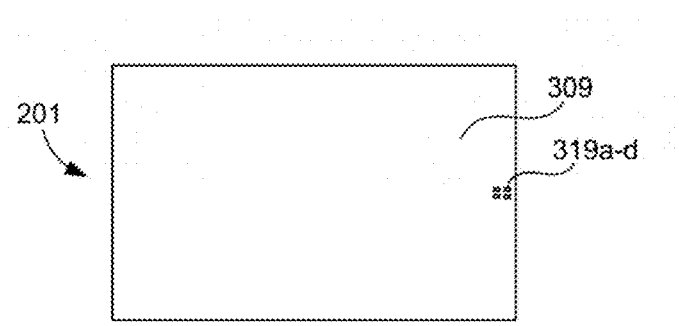
Figure 9B:
Figure 9C:
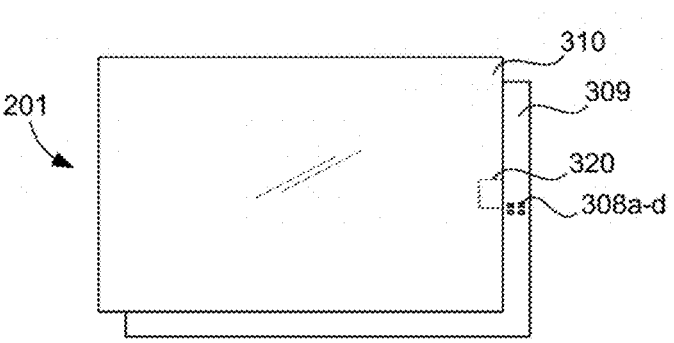

In more detail as to said first station (100A), it is provided that the backsheet (309) has been previously coupled with the layer of encapsulating material (310) in such a way that it is opposite to the back surface of the photovoltaic cells (300-1), therefore facing upwards in the tray; said encapsulating material preferably consists of a thermosetting or thermoplastic material, such as polyolefins or silicone or polyvinyl butyral, or of a cross-linking material, like said EVA, which is thermally fixed or fixed by gluing onto the backsheet itself. Before adding said layer of encapsulating material, the backsheet can be advantageously prepared to facilitate the electrical connection to the junction box which is joined at the back to the panel after the rolling phase (202); this preparation can also occur prearranging conductive inserts (308*a-d*) within holes (319*a-d*) open in correspondence of the clamps of the back junction box (FIGS. 9*a-c*). This preparation can occur according to known techniques such as, as a non-exhaustive example, those described in ITTV2013A000059 (Baccini), ITTV2013A000060 (Baccini), ITTV2013A000193 (Baccini) or any solution of the automatic type which is intended to integrate in the backsheet interface conductive elements, like conductive pads, in such a way as to facilitate the electrical connection of the terminal points of the circuit to the back junction box.

In said first station (100A), said backsheet (309, 310) is preferably picked out of a pile arranged on a pallet placed in the picking-up zone (108) by the Cartesian robot (101) being provided with a vacuum device in the mobile head (103), with a picking hand which picks up one single backsheet and transports it into the working zone on the tray (109), also checking its orientation by means of said control device which substantially consists of a vision system comprising cameras and position recognition software. This recognition allows the programmable unit which manages the movement along the axes of said robot (101-2), by an algorithm, to orient it in such a way as to lay on the empty tray, in an oriented and repeatable way, said backsheet (309) randomly picked from the pallets in said picking-up zone (108). Said tray (109), in particular, can be provided with conventional means for holding the backsheet during the following assembly phases, for example of the type with automatic pushers. Moreover, said tray is advantageously provided with an identification code and with reference signs in such a way that the backsheet, besides being fixed in a pre-set position, can be subsequently monitored by the following control devices for possible compensations of the coordinates after the various operating phases. The invention allows to assemble on each tray a photovoltaic panel having standard sizes widespread on the market; in particular, it is particularly advantageous in the case of panels made up of 48 cells, or 60 cells or even 72 cells, arranging them in horizontal and repeated rows of 6 cells each, not requiring any physical re-fitting but only a selection of general software arranged for sequences of operations related to the assembly of a panel made up of 48 cells, or 60 cells, or 72 cells.

In more detail as to said second station (100B), the proposed assembly system provides that after the arrival and the locking of the tray in the pre-set position a window (320) is opened in the sheet of encapsulating material (310) in correspondence of said metal inserts (308*a-d*) already included (FIGS. 9*c-d*); this zone is advantageously pre-cut in the sheet and left free, that is to say, not fixed on the backsheet for the purpose of enabling its opening. Furthermore, in said station a small amount of ECA is laid onto the conductive inserts by means of the automatic dispenser, being exactly measured for contacting. Afterwards, the head (304) and bottom cross ribbons (303), already prepared and cut to size (FIG. 9*e*), are laid by means of Cartesian robots. This positioning is carried out with precision thanks to said vision system with dedicated software which is integrated with the control of the movement axes of said Cartesian robot (101). Therefore, in this way one realizes the electrical continuity between the conductive inserts (108*a-d*) of the backsheet and said head cross ribbons (304).

Said cross ribbons (303-4) are advantageously pre-fixed concomitantly to their positioning; to this purpose, the same picking hand which holds them in the correct position in contact with the layer of encapsulating material can advantageously integrate means for the selective heating placed at the correct distance, as described above, realizing said pre-fixing on the encapsulating material. It is observed, in particular, that said conductive elements (302-4) are excellent electrical and thermal conductors and therefore enable a fast and effective heating of the underlying encapsulating material, activating its adhesive feature. Said heating is preferably carried out for a time between 2 and 5 seconds, with temperatures between 70° C. and 130° C. Said window (320) is then closed, preferably with the marking operation of the type called tagging.

In more detail as to said third station (100C), after the arrival and locking of the tray in the pre-set position by means of an automatic dispenser a small amount of ECA is laid onto said head and bottom cross ribbons, in the form of perfectly measured single drops; afterwards, by means of Cartesian robots for industrial use, one lays the first row of interconnecting ribbons (302) prepared and cut to size (FIG. 9*f*). In particular, it is observed that said positioning is of high precision thanks to the vision system and to the software which interact with the control of the movement axes of the Cartesian robot (101). In this way one realizes an electrical continuity between the head and bottom cross ribbons previously fixed in the backsheet with the longitudinal interconnecting ribbons. Said ribbons (302) are fixed on the encapsulating material preferably concomitantly to their laying, by means of a pre-fixing system substantially equal to the above-described system and integrated in the previous station. At the end, the control device checks the correct execution of the operation.

In more detail as to said fourth station (100D), after the arrival and the locking of the tray (109) in a pre-set position, a measured amount of ECA is laid onto the interconnecting ribbons (302) already laid, with the same dispensing system as the previous station; afterwards one takes from a specific loading station by means of Cartesian robots a series of 6 solar cells which are laid 3 by 3 in an alternated sequence on the tray in such a way that the previously laid and fixed head and bottom interconnection strings match the busbars situated on the back faces of the cells (FIG. 9*g*).

On said series of cells the related interconnecting ribbons (302) can have been previously prepared, cut to size, suitably shaped and fixed on the front of the cells in such a way as to adhere with precision to the front busbars (313, 315), or they can be mounted on said busbars (313, 316) situated on the front faces of the cells after these have been assembled and laid on the layer of encapsulating material (310) in the tray (109) upon measured dispensing of ECA on the front busbars of said cells, with the same dispensing system as the previous stations (FIG. 9*h*). Said cells reach the fourth station (100D) generally stacked in boxes, or racks, and from these they are individually extracted or picked up, pre-oriented on feeding belts from which they are picked up by the anthropomorphic or Cartesian robots to be laid in the working zone individually or in multiple series. Therefore, a similar pre-fixing is carried out, as described above, after the laying of the cells on the encapsulating material (310) and in correspondence of said already prefixed interconnecting ribbons; said pre-fixing being preferably concomitant to the laying of the cells. The control device consisting of the cameras and vision software allows to check the correct execution of the operation and the correct arrangement of cells and strings.

In more detail as to the completion of all the cells and the interconnections of the panel, it is observed that said sequence of operations for the laying and pre-fixing of the strings of solar cells laid in parallel rows on the first layer of encapsulating material (310), with the related interposed interconnecting ribbons (302), being in their turn fixed upon measured dispensing of ECA from time to time interposed between cells (300-1) and ribbons (302), must be repeated several times in sequence in the fourth station (100D), until the completion of the whole panel. As an alternative, also to shorten the cycle time balancing the crossing time between the stations, said fourth station can be advantageously repeated in one or more contiguous twin stations, similarly equipped to complete in sequence different and complementary zones of the same backsheet.

To this purpose, in an advantageous and preferred configuration of the invention (10, 20), the laying of each string of cells and related interconnecting ribbons is carried out in a combined way in two twin stations, identical to each other and arranged in sequence, to progressively fill in sequence two different and complementary zones of the same backsheet; in this case said fourth station (100D) is repeated in a fifth station (100E) constructively identical to said fourth station, which is programmed to lay in rows cells and interconnecting ribbons only in correspondence of half of the strings of cells, alternated with respect to each other, while said fifth station (100E) covers the second half in an alternated and complementary way, until completing the whole panel (FIG. 9*g-i*). The invention (10, 20) also enables alternative assembly sequences in said fourth (100D) and fifth (100E) station, or further twin stations equally intended for the assembly of cells and interconnecting ribbons, for example it being possible to start the loading indifferently from the head or from the bottom of the panel.

The last row of interconnecting ribbons (302) is directly connected to the head (304) and bottom cross ribbons (303) to complete the electric circuit of all the strings of cells connected in series, with the ends of the circuit directly on the metallic inserts (305, 307, 308*a-d*), being ready for the connection to the back junction box.

In more detail as to the sixth station (100F), after the arrival and locking of the tray in a pre-set position, the front layer of encapsulating material is laid to cover the cells previously placed with the related interconnections; said encapsulating material preferably consists of a thermosetting or thermoplastic material, such as polyolefin, silicone or PVB, or it is a cross-linking material like commonly EVA, which can advantageously be unwound from a reel situated in proximity to said sixth station and cut into sheets of the size suitable for the surface of the panel being worked. The sheet of front encapsulating material can advantageously be taken and laid by the above-described Cartesian robot system. The control device allows to check the correct execution of the operation.

In more detail as to the seventh station (100G), after the arrival and locking of the tray in a pre-set position the front glass is laid to cover and complete the panel; said glass can advantageously be picked up from a pile arranged on a pallet in proximity to said seventh station, in a specific position so as to be able to be advantageously picked up and laid by the above-described Cartesian robot system. The control device allows to check the correct execution of the operation.

If the assembled panel is compliant, it proceeds up to the eighth station (100H) where, after the arrival and locking of the tray in a pre-set position, the overturn of the tray containing the panel is carried out, without offsetting of the single components contained in it thanks to the controlled pressure of pushers which enclose and press the glass onto the tray during the whole 180° revolution, with the rotation axis placed parallel to the major side of the tray orthogonal to the direction of advancement of the tray, until the positioning of said panel in the most suitable position for the outcoming from the plant (10), that is to say, with the glass facing downwards sliding laterally on a belt conveyor (115), upon release of said tray from the panel by means of the pressers which are pulled back, for the purpose of sending the panel towards a conventional rolling furnace. Said overturn is carried out in such a way as to allow in any case in each of its positions of start or end of the overturn the transit of the trays on the lower return path in order to never interrupt the recirculation of the trays, if not exclusively during the actual rotation. After the outcoming of the panel, in said eighth station one carries out a counter-rotation in the opposite direction of the tray made empty for the purpose of replacing it in its original arrangement. If, on the other hand, the panel is non-compliant with one of the check phases previously performed (FV1-7) (FIGS. 8*a-b*), in said eighth station the 180° rotation is not carried out but one passes directly to the last station.

In the ninth and last station (100I), if said compliant panel has come out of the eighth station (100H), the tray made empty descends to a lower sliding level for the return to the first station (100A) through the underlying recirculation system (112). If, on the other hand, the assembled panel is non-compliant, it proceeds directly into said ninth station (100I) along with the tray for the controls and the possible reprocessing, getting out of the line (10) in an orthogonal direction (116), on a specific path with belts or on trolley or other supporting device, and also re-entering after such controls and/or reprocessing (FIGS. 6*b*, 8*b*). From the latter station it is therefore possible from time to time to: extract the tray containing the non-compliant product for the necessary reprocessing, or reinsert the tray containing the reprocessed product for the following possible necessary operations, or also reinsert an empty tray.

In more detail as to the logic of the checks, it has been observed that in the case in which at least one of the controls performed in the passages between said stations has given a negative result as to the correctness of the operation previously carried out, the logic control unit (117) which manages in an integrated way all the operations of the automatic assembly plant (10) will enable the simple transit of the tray with its contents in the following stations until it reaches said last station (100I), without being subjected to the overturn of said eighth station (100H).

Said plant (10, 100A-I), made as described above, follows the operating sequence provided by the automatic assembly method (20) provided by the invention; said method improves the whole production process (200) of the panel (30) which thus provides: the preliminary preparation of the backsheet with conductive inserts and layer of encapsulating material, according to known techniques, the automated assembly in said plant (10, 100A-I) according to the innovative method (20), the final rolling in conventional furnaces (202) and the assembly of the back junction box and of the frame (203). Said method (20), in particular, optimizes the assembly of the components with an automatic cycle made up of sequential working phases which horizontally forms a panel already ready for rolling, without handling. Said method (20) comprises the following Operating phases (F1-9B)(FIG. 7) and related sub-phases (FIGS. 8*a-b*) with Check phases (FV1-7):

Operating phase (F1) of loading of the backsheet (309) on the tray (109) having been previously prepared with the encapsulating material (310) and optionally with inserts (108*a-d*), in the station (100A) (FIGS. 9*a-c*) and with the related sub-phases: F1.0) transfer and locking of the tray from the recirculation level (112) to the working level (111); F1.1) loading of the backsheet prepared on the tray; FV1) check.

Operating phase (F2) of application of the head (304) and bottom cross ribbons (303), in the station (100B) (FIGS. 9*d-e*) and with the related sub-phases: F2.0) transfer and locking of the tray from the previous station; F2.1) laying of the bottom cross ribbons (303); F2.2) pre-fixing of the bottom cross ribbons; F2.3) opening of the window (320) of the encapsulating material (310); F2.4) measured dispensing of ECA on the inserts (108*a-d*); F2.5) laying of the head cross ribbons (304); F2.6) pre-fixing of the head cross ribbons; F2.7) closing and tagging of the window of the encapsulating material; FV2) check.

Operating phase (F3) of application of the first row of head and bottom interconnecting ribbons (302), in the station (100C) (FIG. 9*f*) and with the related sub-phases: F3.0) transfer and locking of the tray from the previous station; F3.1) measured dispensing of ECA on the bottom cross ribbons; F3.2) laying of the bottom interconnecting ribbons in an alternated series; F3.3) pre-fixing of the bottom interconnecting ribbons; F3.4) measured dispensing of ECA on the head cross ribbons; F3.5) laying of the head interconnecting ribbons in an alternated series; F3.6) pre-fixing of the head interconnecting ribbons; FV3) check.

Operating phase (F4) of laying of the cells (300-1) and interconnecting ribbons (302) from the bottom in alternated and repeated series to complete half of the cover, in the station (100D) (FIGS. 9*g-i*) and with the related sub-phases: F4.0) transfer and locking of the tray from the previous station; F4.1) measured dispensing of ECA on the first row of interconnecting ribbons from the bottom; F4.2) laying of the cells on the first row, in an alternated series (FIG. 9*g*); F4.3) pre-fixing of the row of cells on the ribbons; F4.4) measured dispensing of ECA on the row of cells (FIG. 9*h*); F4.5) laying of the interconnecting ribbons on the row of cells; 4.6) pre-fixing of the row of cells and ribbons; F4.7) repetition from F4.1 for each following row (FIG. 9*i*); FV4) check.

Operating phase (F5) of laying of the cells (300-1) and interconnecting ribbons (302) from the head in alternated and repeated series in a complementary way with respect to the twin station, in the station (100E) (FIGS. 9*g-i*) and with the related sub-phases: F5.0) transfer and locking of the tray from the previous station; F5.1) measured dispensing of ECA on the first row of interconnecting ribbons from the head; F5.2) laying of the cells on the first row, in an alternated series (FIG. 9*g*); F5.3) pre-fixing of the row of cells on the ribbons; F5.4) measured dispensing of ECA on the row of cells (FIG. 9*h*); F5.5) laying of the interconnecting ribbons on the row of cells; F5.6) pre-fixing of the row of cells and interconnecting ribbons; F5.7) repetition from F5.1 for each following row (FIG. 9*i*); FV5) check.

Operating phase (F6) of laying of the upper layer of encapsulating material, in the station (100F) and with the related sub-phases: F6.0) transfer and locking of the tray from the previous station; F6.1) unwinding of the sheet of upper encapsulating material; F6.2) cutting; F6.3) picking and laying; FV6) check.

Operating phase (F7) of laying of the front glass, in the station (100G) and with the related sub-phases: F7.0) transfer and locking of the tray from the previous station; F7.1) picking and laying of the glass; FV7) check.

Operating phase (F8) of overturn of the panel if compliant, in the station (100H) and with the related sub-phases: F8.0) transfer and locking of the tray from the previous station; F8.1) overturn of the panel and counter-overturn of the tray; F8.2) outcoming on the belt with the glass facing downwards.

Operating phase (F9A) of recirculation of the empty tray, in the station (100I) and with the related sub-phases: F9A.0) transfer and locking of the tray from the previous station; F9A.1) descent of the tray and return to the tray recirculation level.

Operating phase (F9B), alternative to the Operating phase (F9A) in the station (100I), unloading of the tray with the panel if non-compliant and with the related sub-phases: F9B 0.0) transfer and locking of the tray from the previous station; F9B.1) outcoming of the tray with the panel for analysis and/or reprocessing purposes; F9B.2) incoming of the tray with the panel after analysis and/or reprocessing.

It has been observed that the characteristics of the above-described plant (10), comprising the single operating stations (100A-I), as well as the characteristics of the above-described method (20) can be easily adapted according to the specific application configuration, for example to assemble photovoltaic panels with non-standard sizes or configurations or cell arrangement or for cells with a particular metallization. Furthermore, for the purpose of lowering industrial costs also saving the space occupied by the plant (10) and the related investment, it is provided that some of the above-described phases instead of being carried out in different stations, as explained above for the sake of descriptive simplicity, may advantageously be concentrated and/or integrated in a smaller number of stations though keeping unchanged the single functions of the plant and the logic sequence of the automatic assembly method; for example, the functions of said fourth and fifth stations can be performed by one station only with lower plant productivity, or the functions of said sixth and seventh stations or still of the eighth and ninth stations can be concentrated, however lengthening the total cycle time.

Figure 4A:
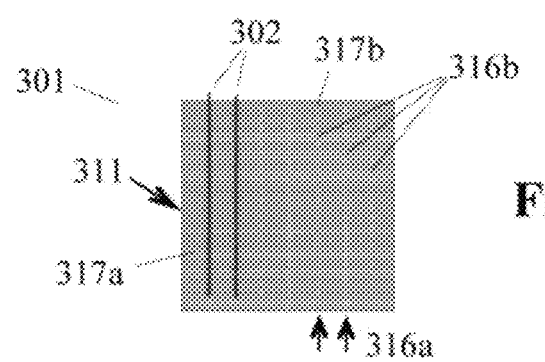
FIGS. 4a-b orthogonally show the front (FIG. 4a) and the back (FIG. 4b) of a cell of crystalline silicon with innovative busbars of the discontinuous type in the form of conductive pads which make the assembly by means of the proposed plant and method particularly advantageous.
Figure 4B:
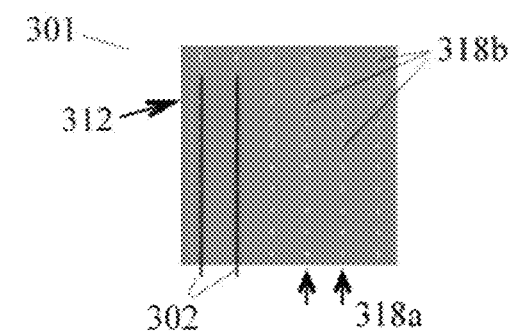

Moreover, it has been observed that by the above-described plant (10) and system (20) it is possible to obtain great precision and repeatability over the whole working area corresponding to the entire surface of the tray and particularly of the panel, both of the measured dispensing of ECA and of the positioning of the cells and of the related interconnecting ribbons; such an advantage provides an innovative design approach to the construction of the panel (30) and also to the surface metallization of the photovoltaic cells (300-1); in particular, the metallization surface of the busbars (313, 315, 316, 318) can be reduced also with a significant saving of costs, as described above. As a non-exhaustive example (FIGS. 4a-b), said busbars (316, 318) can be optimized limiting the metallization surface exactly to the surface where the drops of ECA are applied punctually, with the double advantage of reducing the expensive silver paste as well as of reducing the width of said interconnecting ribbons (302) with less shading. Furthermore, it is also possible to increase the number of said busbars as there are not the known construction and dimension limits of the conventional stringing systems; in this way the metallization grid of the cell front can be of further use for the consequent possible reduction in the height and volume of the fingers (314, 317), which can thus become much thinner and more numerous transporting over a smaller length equal or greater current. Hence results an important saving of expensive materials and lower operating difficulties with respect to the realization of the conventional narrow and thick fingers, also with less wastes and greater energy conversion efficiency both of the cells and of the assembled panel. To summarize, therefore, the present invention simplifies and makes more economical the manufacturing process of photovoltaic cells as well.

It has been ascertained that the present invention, in its basic configuration described herein, allows to obtain an equivalent production capacity between about 60 MW/year and 90 MW/year, according to the power and to the number of solar cells of each panel, which corresponds to about 270,000 panels/year, expandable in a progressive and modular way; such a result is in any case already considerably greater with respect to the conventional and known plants, which moreover have the drawbacks solved by the present invention. The proposed plant (10) and method (20), moreover, have a high application flexibility as they can be configured in such a way as to increase or decrease said production capacity according to the specific industrial application.

Therefore, it has been observed in the practice that the invention has achieved the above-mentioned task and aims realizing an automatic assembly plant (10) and method (20) which provide important advantages for the production of photovoltaic panels (30) in terms of costs, performances, quality and duration and therefore is an important contribution to the advantageous and convenient availability of renewable power sources.

REFERENCE

(10) Automatic production plant with modular and aligned operating stations for the assembly of photovoltaic panels with cells of crystalline silicon connected at low temperature;
(100) workstation of the modular type, (100A) first station of loading on the tray of the backsheet already prepared with conductive inserts and first layer of encapsulating material, (100B) second station of application of the head and bottom cross ribbons, (100C) third station of application of the interconnecting ribbons referred to the first head and bottom row, (100D) fourth station of laying of the cells and of the related interconnecting ribbons following an arrangement in an alternated and repeated series starting from the bottom, (100E) fifth station twin of the fourth station starting from the head, (100F) sixth station of loading of the front layer of encapsulating material, (100G) seventh station of laying of the front glass, (100H) eighth station of overturn of the assembled panel, (100I) ninth station of separation of the panel if compliant or of deviation if non-compliant;
(101) Cartesian robot;
(102) structure of the robot with mobile gantry (102b) on power-operated rails (102a);
(103) mobile head to be equipped according to the working process;
(104) load-bearing frame of the workstation;
(105) protection panel;
(106) transparent plate for visual control;
(107) opening for the incoming-outcoming of the conveying line;
(108) side compartment of loading of the long components;
(109) tray;
(110) carousel conveying line with recirculation of the trays formed by the portions of line comprised in each station;
(111) upper level working surface with tray advancement;
(112) lower level of tray recirculation;
(113) start of the line, upstream of the plant;
(114) end of the line, downstream of the plant;
(115) outcoming of the compliant panel, with the glass facing downwards;
(116) outcoming of the tray with the non-compliant panel and incoming of the tray with the reprocessed panel;

(117) programmable control logic unit, of the PLC type, which supervises the whole plant in an integrated way;
(118) movements of roto-translation of the Cartesian robot, the gantry being constrained to the side rails with independent and coordinated hinge-sliding blocks (118a-b) and telescopic (118c) in such a way as to enable the rotation around the vertical axis (118d);
(119) movements of the mobile head, with translations (119a) along the gantry and vertical movements (119b) for the purposes of the working processes;
(20) automatic horizontal assembly method with connections at low temperature and pre-fixing, as provided by the invention;
(200) complete process for obtaining the finished product;
(201) preparation of the backsheet with conductive inserts and encapsulating material, according to known techniques;
(202) rolling, according to known techniques;
(203) assembly of the box and frame, according to known techniques;
(30) photovoltaic panel with front-back-contact cells;
(300) front-back-contact photovoltaic cell of crystalline silicon of the known and conventional type;
(301) front-back-contact photovoltaic cell of crystalline silicon optimized for the assembly by the plant and system proposed by the invention;
(302) longitudinal interconnecting ribbons or string for the front-back electrical interconnection between adjacent cells;
(303) bottom cross ribbons or string of general connection on the bottom of the panel;
(304) head cross ribbons or string of general connection on the head of the panel;
(305) element of connection to the conductive inserts in correspondence of the back junction box;
(306) frame;
(307) zone of connection to the back junction box;
(308a-d) conductive inserts for back junction box;
(309) supporting backsheet;
(310) layer of encapsulating thermoplastic material;
(311) exposed face of the cell, with negative polarity;
(312) covered face of the cell, with positive polarity;
(313) front busbar of the continuous type on which a string of the interconnecting ribbon type is superimposed and electrically connected;
(314) fingers for busbars of the continuous type;
(315) back busbar of the continuous type;
(316a) front busbar of the discontinuous type in the form of hatching being made up of aligned conductive pads (316b);
(317a) cross fingers for conductive pads;
(317b) longitudinal fingers for conductive pads;
(318a) back busbar of the discontinuous type in the form of hatching being made up of aligned conductive pads (318b);
(319a-d) holes for conductive inserts;
(320) pre-cut window on encapsulating layer;
(321) measured drops of ECA;
(F1-F9) Operating phases of the assembly with the related sub-phases (F1.0-F9B 0.2) and Check phases (FV1-7).

I claim:
1. A process for automatic assembly of photovoltaic panels with H-type solar cells with a front-back connection and a plant having a plurality of workstations in which the workstations progressively assemble the photovoltaic panels trays, the process comprising:

forming a supporting backsheet with a layer of encapsulating material;
processing the photovoltaic panel on a single working surface adjacent to the plurality of workstations arranged sequentially in a linear series and adjacent to each other so as to be horizontally crossed by a conveying line of trays, the conveying line being at a working level and at a underlying circulation level;
progressively forming the photovoltaic panels horizontally by a superimposition of components on each of the trays;
laying rows of electrically conductive elements on a supporting backsheet loaded on the tray, the step of laying comprising measuring and dispensing electrically conductive adhesive at room temperature;
pre-fixing conductive elements to a underlying layer of encapsulating material concomitantly to the step of laying, the step of pre-fixing applying localized heating to prevent relative translations of the conductive elements; and
loading a front encapsulating material and a front glass onto an overturned photovoltaic panel downstream of the plant.

2. The process of claim 1, further comprising:
loading the formed supporting backsheet onto the tray by transferring and locking the tray from the recirculation level of the working level, then by loading the formed supporting backsheet onto the tray, and then checking the loaded supporting backsheet and tray.

3. The process of claim 1, further comprising:
applying head cross ribbons and bottom cross ribbons to the formed supporting backsheet, the step of applying head cross ribbons and bottom cross ribbons comprising:
transferring and locking the tray;
laying the bottom cross ribbons;
pre-fixing the bottom cross ribbons;
opening a window formed in the encapsulating material;
measuring and dispensing the electrically conductive adhesive onto inserts;
laying the head cross-ribbons;
pre-fixing the head cross-ribbos; and
closing the window of the encapsulation material.

4. The process of claim 3, further comprising:
applying a first row of head interconnecting ribbons and bottom interconnecting ribbons comprising the steps of:
transferring and locking the tray;
measuring and dispensing electrically conductive adhesive onto the bottom cross ribbons;
laying the bottom interconnecting ribbons in an alternating series;
pre-fixing the bottom interconnecting ribbons;
measuring and dispensing the electrically conductive adhesive onto the head cross ribbons;
laying the head interconnecting ribbons in an alternating series; and
pre-fixing the head interconnecting ribbons.

5. The process of claim 4, further comprising:
laying the solar cells and the head interconnecting ribbons and the bottom interconnecting ribbons from a bottom thereof and an alternating and repeating series, the step of laying the solar cells comprising:
transferring and locking the tray from a previous station;

measuring and dispensing the electrically conductive adhesive on a first row of interconnecting ribbons from a bottom thereof;

laying the solar cells along a row;

pre-fixing the row of laid solar cells onto the row of interconnecting ribbons;

measuring and dispensing the electrically conductive adhesive onto the row of solar cells;

laying the interconnecting ribbons onto the row of solar cells; and pre-fixing the layered interconnecting ribbons and solar cells.

6. The process of claim 1, further comprising:

laying solar cells and interconnecting ribbons from a head on the supporting backsheet comprising:

transferring and locking a tray from a previous station;

measuring and dispensing electrically conductive adhesive onto a first row of the interconnecting ribbons from the head;

laying the solar cells on a first row;

pre-fixing the solar cells on the interconnecting ribbons;

measuring and dispensing electrically conductive adhesives onto the first row of solar cells;

laying the interconnecting ribbons onto the first row of solar cells; and repeating the above steps for each following row of solar cells.

7. The process of claim 1, the step of forming comprising:

transferring and locking the tray from a previous station;

unwinding a sheet of encapsulating material;

cutting the unwound sheet of encapsulating material; and picking up and laying the cut sheet of encapsulated material.

8. The process of claim 1, the step of loading the front encapsulating material and the front glass comprising:

transferring and locking the tray from a previous station; and picking up and loading the front glass onto the photovoltaic panel.

9. The process of claim 8, further comprising:

overturning the photovoltaic panel so that the front glass faces downwardly onto a belt.

10. The process of claim 1, further comprising:

recirculating an empty tray by descending the empty tray and returning the empty tray to the recirculation level.

11. The process of claim 1, further comprising:

checking the photovoltaic panel for compliance;

outputting the checked photovoltaic panel if non-compliant.

* * * * *